United States Patent
Kim et al.

(10) Patent No.: US 7,819,539 B2
(45) Date of Patent: Oct. 26, 2010

(54) LIGHT EMITTING DIODE, BACKLIGHT ASSEMBLY HAVING THE SAME AND METHOD THEREOF

(75) Inventors: Gun-Woo Kim, Yongin-si (KR); Jae-Byung Park, Seongnam-si (KR); Don-Chan Cho, Seongnam-si (KR); Hae-Il Park, Seoul (KR); Jin-Seob Byun, Seoul (KR); Jung-Han Shin, Yongin-si (KR); Seon-Tae Yoon, Seoul (KR); Sung-Jin Hong, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/423,660

(22) Filed: Apr. 14, 2009

(65) Prior Publication Data

US 2010/0103648 A1    Apr. 29, 2010

(51) Int. Cl.
*F21V 33/00*    (2006.01)

(52) U.S. Cl. .................... 362/84; 362/800; 362/97.3; 362/249.02; 313/112; 313/512; 313/110

(58) Field of Classification Search .................. 362/84, 362/97.3, 249.02, 800; 313/112, 512, 110
See application file for complete search history.

(56) References Cited

U.S. PATENT DOCUMENTS

| | | | | |
|---|---|---|---|---|
| 5,962,971 A | * | 10/1999 | Chen | 313/512 |
| 7,132,787 B2 | | 11/2006 | Ozkan et al. | |
| 7,239,080 B2 | * | 7/2007 | Ng et al. | 313/502 |
| 2004/0145895 A1 | * | 7/2004 | Ouderkirk et al. | 362/260 |
| 2007/0045641 A1 | * | 3/2007 | Yin Chua et al. | 257/98 |
| 2007/0091587 A1 | * | 4/2007 | Han | 362/97 |

FOREIGN PATENT DOCUMENTS

| | | |
|---|---|---|
| KR | 1020060111645 A | 10/2006 |
| KR | 1020070101046 A | 10/2007 |
| KR | 1020070119104 A | 12/2007 |

* cited by examiner

*Primary Examiner*—Laura Tso
(74) *Attorney, Agent, or Firm*—Innovation Counsel LLP

(57) ABSTRACT

A light emitting diode (LED). In one embodiment, the LED comprises a base including a cavity, an LED chip disposed on a bottom of the cavity and configured to generate a first light, and a light conversion layer. The light conversion layer includes an upper substrate, a lower substrate and a wavelength conversion particle. The light conversion layer is configured to convert a portion of the first light into a second light according to light emitted by the wavelength conversion particle. Furthermore, the light conversion layer is disposed on an upper surface of the base.

29 Claims, 4 Drawing Sheets

LIGHT EMITTING DIODE, BACKLIGHT ASSEMBLY HAVING THE SAME AND METHOD THEREOF

PRIORITY STATEMENT

This application claims priority under 35 U.S.C. §119 to Korean Patent Application No. 2008-105660, filed on Oct. 28, 2008 in the Korean Intellectual Property Office (KIPO), the contents of which are herein incorporated by reference in their entirety.

BACKGROUND OF THE INVENTION

1. Field of the Invention

The present invention relates generally to light emitting diodes, and more particularly to light emitting diodes including a light conversion layer which converts received light to light with different wavelength.

2. Description of the Related Art

A white LED using a semiconductor, having advantages such as a long lifetime, capability of reduced size and operability at low voltage, is receiving attention as a next-generation LED.

There has been proposed a conventional technique of realizing white light by applying red, green and blue phosphors around a UV short wavelength LED. In this configuration, the red, green and blue phosphors are excited by the UV LED, and thus emit red, green and blue light, respectively. The red, green and blue light then mixes to produce white light.

However, there are a limited number of conventional phosphors that have sufficient light conversion efficiencies. The emission spectrum of these phosphors is not easily changed. Futhermore, the spectra are less than ideal in that the amount of light emitted varies as a function of wavelength. Hence, even by combining several phosphors, an optimum white light source is not obtained.

"Quantum dot" (QD) phosphors are phosphors whose emission spectra depends on the size of the particles, and hence can be used to convert light to a predetermined wavelength by utilizing the appropriate sized particles. Quantum dots are nanometer-sized semiconducting materials which exhibit quantum confinement effects. When the quantum dots are irradiated by light from an excitation source to reach energy excitation states, they emit energies corresponding to the respective energy band gaps. Since the control over the size of the quantum dots effectively controls the corresponding band gaps, energies of various wavelength regions can be obtained. QD phosphor is generally used in the form of resin mixture. Ligands are usually attached to the outer surface of the QD for high stability and high dispersion.

However, resin typically used for QD is optimized for inorganic phosphors. Since ligands conjugated with the outer surface of the QD are organic substances, resin interacts with the ligands, thereby hampering efficiency and durability of QD phosphors.

SUMMARY OF THE INVENTION

The present invention provides a light emitting diode (LED) including a base, a light conversion layer and an LED chip. Some embodiments of the invention are capable of achieving high efficiency and long durability of the light emitting diode.

The present invention also provides a backlight assembly including the light emitting diode.

These and other aspects of the present invention will be described in or be apparent from the following description of the exemplary embodiments.

According to an exemplary embodiment of the present invention, a light emitting diode (LED) comprises a base including a cavity, an LED chip disposed on a bottom of the cavity and configured to generate a first light, and a light conversion layer. The light conversion layer includes an upper substrate, a lower substrate and a wavelength conversion particle. The light conversion layer is configured to convert a portion of the first light into a second light according to light emitted by the wavelength conversion particle. Furthermore, the light conversion layer is disposed on an upper surface of the base.

In another exemplary embodiment, a light emitting diode (LED) comprises a base including a cavity, the cavity having a bottom and an opening, an LED chip disposed on the bottom and configured to generate a first light, and a light conversion layer. The light conversion layer includes an upper substrate, a middle substrate, a lower substrate, a sealing material and an organic solution with a wavelength conversion particle. The light conversion layer is disposed on an upper surface of the base. Additionally, the organic solution with the wavelength conversion particle fills gaps formed between the upper substrate and the middle substrate, and between the middle substrate and the lower substrate.

In still another exemplary embodiment of the present invention, a backlight assembly comprises a light emitting diode (LED) including a base including a cavity with a bottom and an opening, an LED chip disposed on the bottom and configured to generate a first light, and a light conversion layer. The light conversion layer includes an upper substrate, a lower substrate, and a wavelength conversion particle, and is configured to convert a portion of the first light into a second light. The assembly also includes an optical sheet disposed above the light emitting diode, and a receiving container receiving the light emitting diode and the optical sheet. The light conversion layer is disposed on an upper surface of the base, and comprises an organic solution filling a gap between the upper substrate and the lower substrate. The wavelength conversion particle is dispersed within the organic solution.

In still another exemplary embodiment, a backlight assembly comprises a light emitting diode (LED) including a base including a cavity with a bottom and an opening, an LED chip disposed on the bottom and configured to generate a first light, and a light conversion layer. The light conversion layer includes an upper substrate, a middle substrate, a lower substrate, and a wavelength conversion particle, and is configured to convert a portion of the first light into a second light. The assembly also includes an optical sheet disposed above the light emitting diode, and a receiving container receiving the light emitting diode and the optical sheet. The light conversion layer is disposed on an upper surface of the base, and the organic solution fills gaps formed between the upper substrate and the middle substrate, and between the middle substrate and the lower substrate.

In still another exemplary embodiment of the present invention, a method of manufacturing a light emitting diode comprises providing an upper substrate of a light conversion layer and a second substrate of the light conversion layer, each of which are transparent and comprise one or more of glass, plastic and resin. The method also includes filling a gap formed between the upper substrate and the second substrate with a wavelength conversion particle dispersed in an aqueous solution. A base is provided, the base including a cavity with a bottom and an opening, and an LED chip disposed on the bottom and configured to generate a first light. The light conversion layer is placed on an upper surface of the base.

DESCRIPTION OF THE DRAWINGS

The above and other aspects, features and advantages of the present invention will become more apparent by describing in more detailed exemplary embodiments thereof with reference to the attached drawings in which.

DETAILED DESCRIPTION OF THE INVENTION

Figure 1:
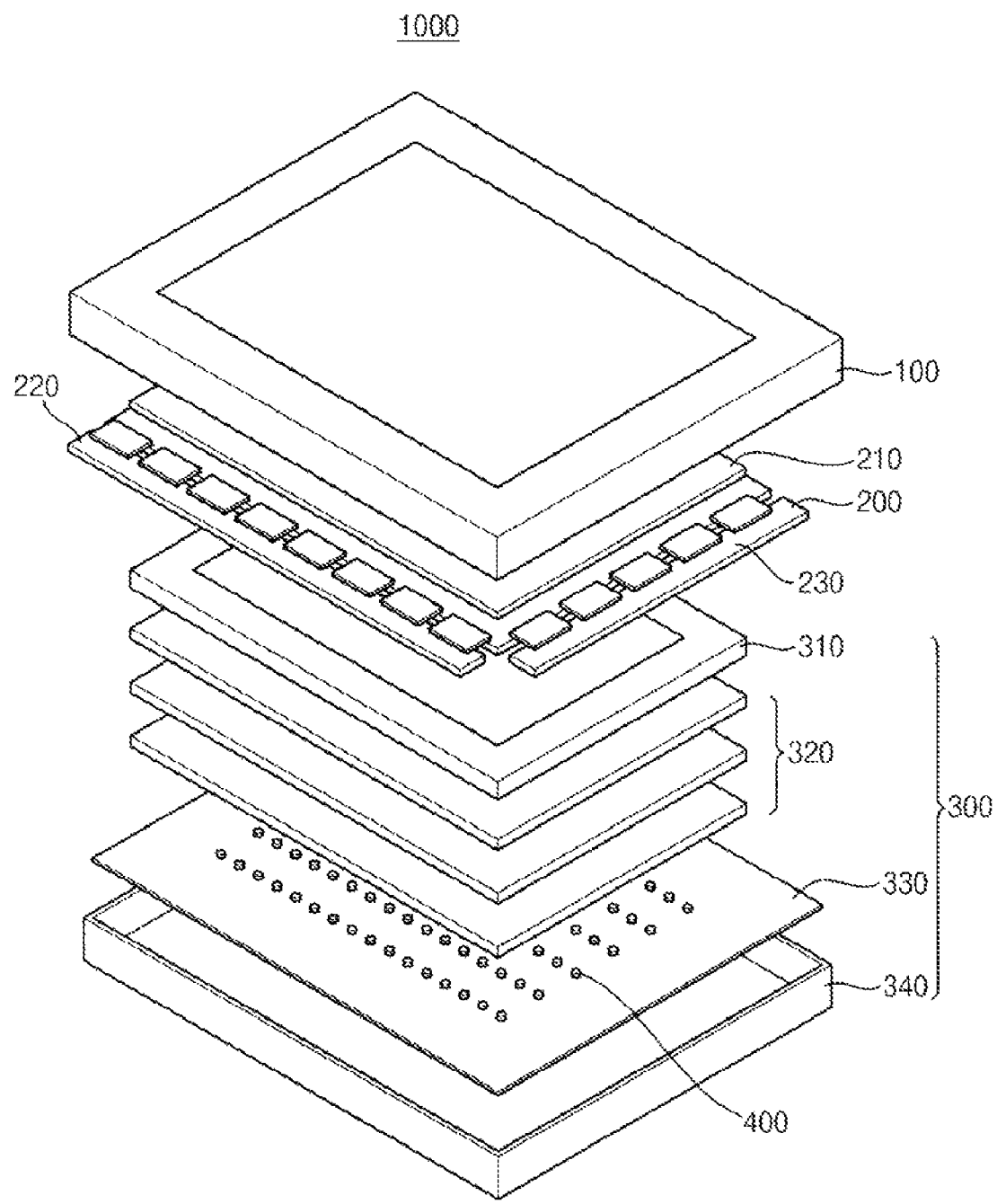
FIG. 1 is an exploded perspective view of an exemplary embodiment of a liquid crystal display according to the present invention.

Hereinafter, the present invention will be described more fully with reference to the accompanying drawings, in which exemplary embodiments of the present invention are shown. This invention may, however, be embodied in many different forms and should not be construed as limited to the exemplary embodiments set forth herein. Rather, these exemplary embodiments are provided so that this disclosure will be thorough and complete, and will fully convey the scope of the invention to those skilled in the art. Like reference numerals refer to like elements throughout.

FIG. 1 is an exploded perspective view illustrating a first exemplary embodiment of a liquid crystal display 1000 according to the present invention. Referring to FIG. 1, a liquid crystal display may include a liquid crystal panel assembly 200, a backlight assembly 300, an upper receiving container 100, and a plurality of LEDs 400.

The liquid crystal panel assembly 200 may include a liquid crystal panel 210, a gate PCB 230 and a data PCB 220. The liquid crystal panel 210 may include a pair of glass substrates, and a liquid crystal layer provided therebetween (not shown). The gate PCB 230 and the data PCB 220 are attached to the liquid crystal panel.

The backlight assembly 300 may include a frame 310, an optical sheet 320, a reflective sheet 330 and a lower receiving container 340.

The reflective sheet 330 is disposed below the LEDs 400 and, in the orientation shown, reflects light upward from below the LEDs 400.

The optical sheets 320 are disposed on the LEDs 400 and serve to diffuse and focus light coming from the LEDs 400. The optical sheet 320 may be an optical plate.

The frame 310 is disposed above optical sheet 320.

The light emitting diodes ("LEDs") 400 are disposed on the lower receiving container 340. The LEDs 400 generate light using an LED driving voltage applied to the LEDs 400 from an external source (not shown). According to the present exemplary embodiment, a blue-green LED 400 and a blue-red LED 400 can be paired as an LED unit, generating white light. A single LED 400 can constitute an LED unit as well, creating white light by itself. Each LED 400 may include a light conversion layer 430 which contains a wavelength conversion particle such as a QD 500. Each LED 400 is placed apart from each other at a predetermined distance, creating uniformity of the light. Specific structures of an LED 400 will be described in more detail below.

The lower receiving container 340 has sidewalls extending from the edges of a bottom surface. The lower receiving container 340 receives the optical sheet 320, the LEDs 400, the reflective sheet 330, the frame 310, and the liquid crystal panel assembly 200 in an area defined by its sidewalls. The lower receiving container 340 also serves to prevent bending of the optical sheets 320.

The lower receiving container 340 is coupled to the upper receiving container 100 so that a periphery of an upper surface of the liquid crystal panel assembly 200 received in the lower receiving container 340 is covered. A window for exposing the liquid crystal panel assembly 200 to the outside is disposed on an upper surface of the upper receiving container 100.

FIG. 1 describes a direct type of backlight assembly. However, the present invention is not limited thereto or thereby. The present invention may be applied to an edge type of backlight assembly.

Figure 2:
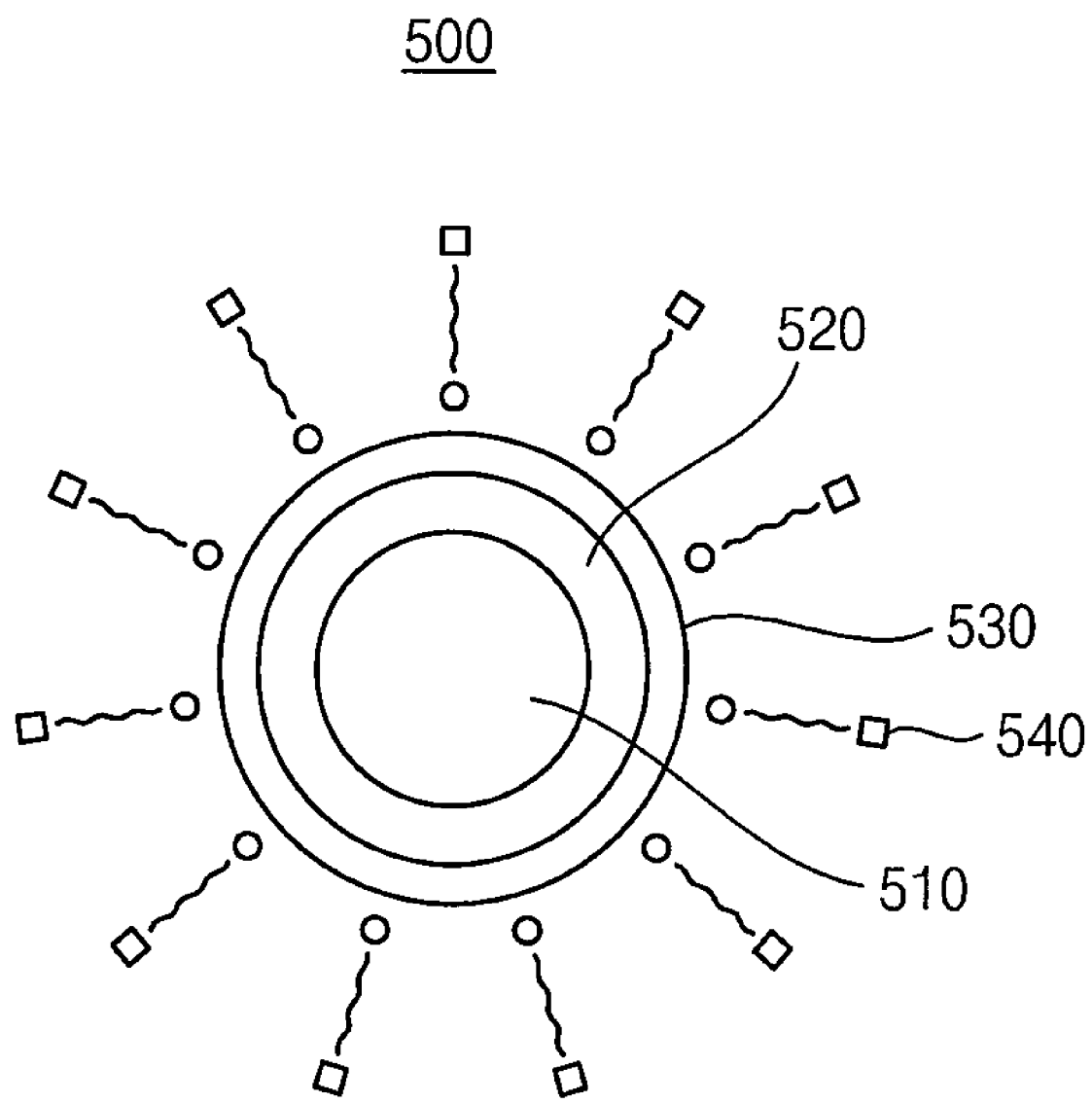
FIG. 2 is a cross-sectional view of a phosphor particle according to an exemplary embodiment of the present invention.

Referring to FIG. 2, a QD phosphor 500 according to the exemplary invention may include a core nanocrystal 510 and at least two layers of shell nanocrystals 520, 530 having different compositions than those formed on the surface of the core nanocrystal 510.

The QD phosphor 500 may include a core nanocrystal 510 and a plurality of shell nanocrystals 520, 530. The QD phosphor 500 may have a structure wherein at least one shell layer 520, 530 of nanocrystals may be formed on a surface of a core nanocrystal 510 to shift the emission wavelength of the core nanocrystal 510 to a longer wavelength and at least one shell layer 520, 530 of nanocrystals may be formed thereon to increase the luminescence efficiency.

The QD phosphor 500 may include at least one material selected from among group II, III, V and VI compound semiconductors. Specifically, the core nanocrystal 510 may include CdSe or InGaP, and the shell nanocrystals 520, 530 may include ZnS or CuZnS. The size of QD phosphor 500 is generally between 1 nm and 10 nm.

Wavelengths of light emitted by the QD phosphor 500 may be controlled by either the size of QD phosphor 500 or molar ratio of a molecular cluster compound to nanoparticle precursors during the synthesis. Organic ligands 540 such as pyridine, mercapto alcohol, thiol, phosphine and phosphine oxide are used as stabilizers for QD phosphors 500 in an unstable state after synthesis. After syntheses, dangling bonds are created on outer surface of the QD phosphor 500 causing the QD phosphor 500 to be unstable. One end of ligands 540 include open bonds which can be conjugated with dangling bonds of QD phosphor 500, making QD phosphor 500 stable.

Figure 3:
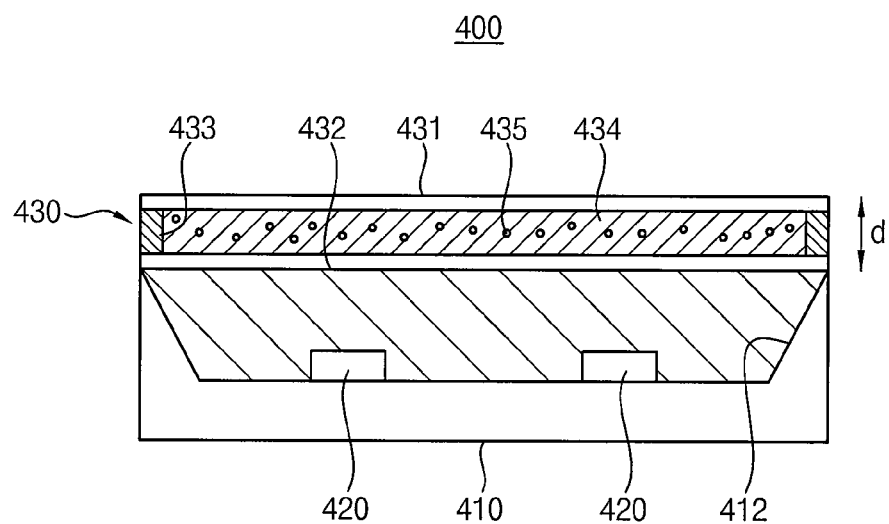
FIG. 3 is a cross-sectional view of an LED package according to the first exemplary embodiment of the present invention.

Referring to FIG. 3, an LED 400 according to a first exemplary embodiment may include a base 410, an LED chip 420, and a light conversion layer 430. The base 410 may include a cavity 412 formed as a substantially conical recess in the base 410. The cavity 412 may include a bottom and an opening. An LED chip 420 may be die-mounted on the bottom of the cavity. The LED chip 420 generates a first light and may include a blue light-emitting source or a UV light-emitting source. The blue light-emitting source has a wavelength range of about 440 nm to about 500 nm. The UV light-emitting source has a wavelength range of about 350 nm to about 400 nm. A transparent resin 411 may fill the cavity 412 and cover the LED chip 420, providing humidity protection around the LED chip 420. The transparent resin 411 may include epoxy or silicon. The base 410 may be made of PPA (Poly Phthal Amide). The anode electrode (not shown) and the cathode electrode (not shown) are formed on the bottom of the base 410, and serve to provide a power supply to the LED chip 420.

Figure 4:
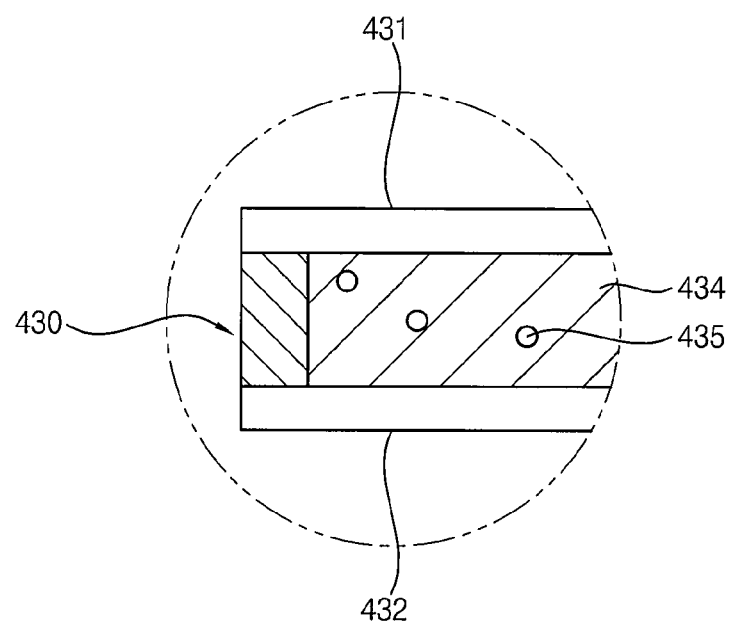
FIG. 4 is an enlarged view of a light conversion layer according to the first exemplary embodiment of the present invention.

Referring to FIGS. 3 and 4, the light conversion layer 430 converts the first light into a second light and may include an upper substrate 431, a lower substrate 432 and a wavelength conversion particle 435. The substrates are transparent and may be made of at least one material selected from among glass, plastic and resin. A generally constant gap d is formed between the two substrates, and an organic solution 434 containing wavelength conversion particles 435 fills the gap d. Joint portions between the upper substrate 431 and the lower substrate 432 are sealed with sealing materials 433 after the constant gap d is filled with the organic solution 432. The sealing materials 433 make the light conversion layer 430 airtight. The wavelength conversion particles 435 are dispersed within the organic solution 434. The organic solution 432 may include at least one of toluene, chloroform and ethanol. The light conversion layer 430 is disposed on an upper surface formed around the opening of the base 410. An adhesive material (not shown) may be used to fix the light conversion layer 430 to the base 410 preventing any movement.

When using the blue light emitting source as an LED chip 420, the wavelength conversion particles 435 may be either a green QD phosphor or a red QD phosphor. The green QD phosphor converts portions of blue light into green light having a wavelength range of about 520 nm to about 560 nm. The red QD phosphor converts portions of blue light into red light having a wavelength range of about 630 nm to about 660 nm. A white light can be generated when light from a blue light emitting source with a green QD phosphor, and a blue light emitting source with a red QD phosphor, are appropriately mixed.

When using the UV light-emitting source as an LED chip 420, the wavelength conversion particles 435 may be one of a blue QD phosphor, a green QD phosphor and a red QD phosphor. The blue QD phosphor converts portions of UV light into blue light having a wave length range of about 430 nm to about 470 nm. A white light can be generated when light from a UV light-emitting source with the blue QD phosphor, a UV light-emitting source with a green QD phosphor, and a UV light-emitting source with a red QD phosphor are appropriately mixed. The color of each QD phosphor 435 is controlled by either the size of the QD phosphor or the molar ratio of a molecular cluster compound to nanoparticle precursors during the synthesis.

Figure 5:
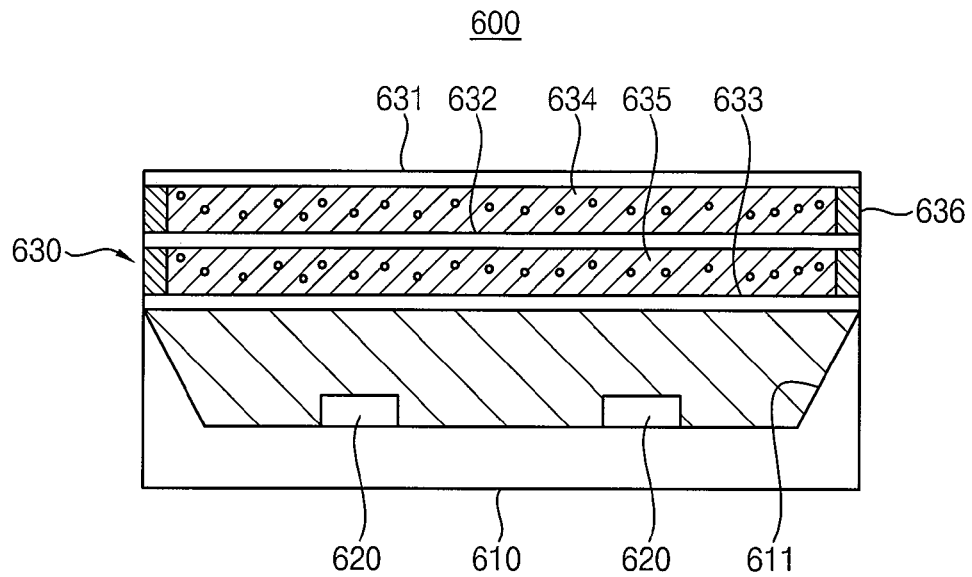
FIG. 5 is a cross-sectional view of an LED package according to the second exemplary embodiment of the present invention.
Figure 6:
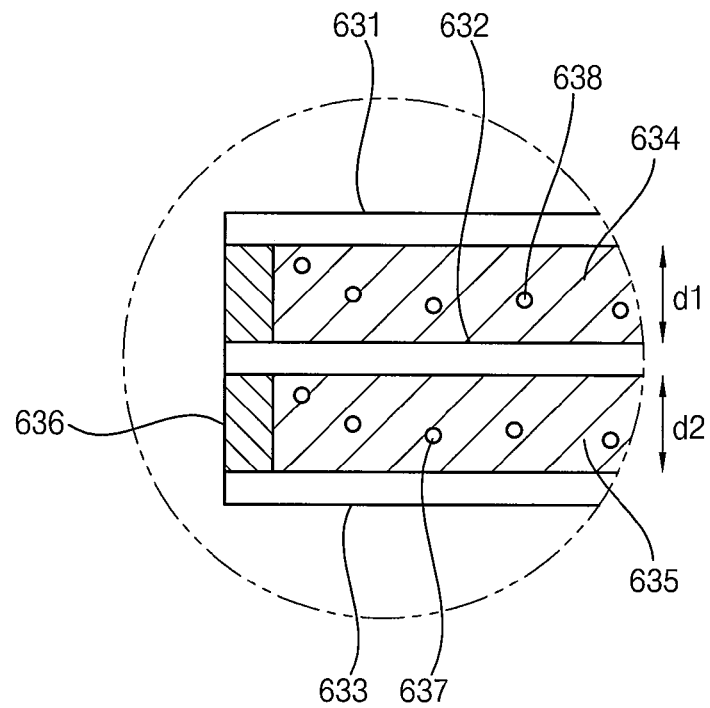
FIG. 6 is an enlarged view of a light conversion layer according to the second exemplary embodiment of the present invention.

Referring to FIGS. 5 and 6, an LED 600 according to a second exemplary embodiment may include a base 610, an LED chip 620, and a light conversion layer 630. One difference between the first exemplary embodiment and the second exemplary embodiment lies in the structure of the light conversion layer 630. The light conversion layer 630 of the second exemplary embodiment may include an upper substrate 631, a middle substrate 632, a lower substrate 633, and wavelength conversion particles 637, 638. The light conversion layer 630 converts a portion of the first light into a second light and a portion of the first light into a third light. The light conversion layer 630 may include an organic solution 635, 634 with the wavelength conversion particles 637, 638 filling each generally constant gap d1, d2 (where the gaps d1, d2 are formed between the upper substrate 631 and middle substrate 632, and between the middle substrate 632 and lower substrate 633, respectively). The wavelength conversion particles 637, 638 are dispersed in the organic solution 635, 634. The wavelength conversion particles 637, 638 may include QD phosphor. Sealing materials 636 seal each joint portion between the upper substrate 631 and middle substrate 632, and between the middle substrate 632 and lower substrate 633, respectively. The sealing materials 636 make the light conversion layer 630 airtight.

The LED chip 620 generating the first light may include a blue light emitting source. The blue light emitting source has a wavelength range of about 440 nm to about 500 nm. An upper portion 635 of the organic solution 635, 634 may then have red QD phosphor wavelength conversion particles 637, while a lower portion 634 of the organic solution 635, 634 may have green QD phosphor wavelength conversion particles 638. The red QD phosphor 637 converts the first light into a second light having a wavelength range of about 630 nm to about 660 nm. The green QD phosphor 638 converts the first light into a third light having a wavelength range of about 520 nm to about 560 nm.

This LED structure generates a white light by mixing blue, green and red light. Certain sequences of color QD phosphors may be preferred. For example, if the organic solution with red QD phosphor is disposed above the organic solution with green QD phosphor, interaction between red QD phosphor and green QD phosphor may occur, making the fabrication process difficult. That is, an additional process for preventing the interaction between the red QD phosphor and the green QD phosphor is omitted, so that the fabrication process may be simplified.

While the present invention has been particularly shown and described with reference to the exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A light emitting diode (LED) comprising:
   a base including a cavity;
   an LED chip disposed on a bottom of the cavity and configured to generate a first light; and
   a light conversion layer including an upper substrate, a lower substrate and a wavelength conversion particle disposed between the upper substrate and the lower substrate, the light conversion layer configured to convert a portion of the first light into a second light according to light emitted by the wavelength conversion particle;
   wherein the light conversion layer is disposed on an upper surface of the base, and
   wherein the light conversion layer includes an organic solution filling a gap between the upper substrate and the lower substrate, and the wavelength conversion particle dispersed within the organic solution.

2. The light emitting diode of claim 1, wherein the light conversion layer further comprises sealing materials sealing a joint portion between the upper substrate and the lower substrate.

3. The light emitting diode of claim 1, wherein the wavelength conversion particle comprises quantum dots, the quantum dots including at least one material selected from among group II, III, V and VI compound semiconductors.

4. The light emitting diode of claim 3, wherein the first light has a wavelength in a range of about 440 nm to about 500 nm, and the second light has a wavelength in a range of about 520 nm to about 560 nm.

5. The light emitting diode of claim 3, wherein the first light has a wavelength in a range of about 440 nm to about 500 nm, and the second light has a wavelength in a range of about 630 nm to about 660 nm.

6. The light emitting diode of claim 3, wherein the first light has a wavelength in a range of about 300 nm to about 400 nm, and the second light has a wavelength in a range of about 440 nm to about 500 nm.

7. The light emitting diode of claim 3, wherein the first light has a wavelength in a range of about 300 nm to about 400 nm, and the second light has a wavelength in a range of about 520 nm to about 560 nm.

8. The light emitting diode of claim 3, wherein the first light has a wavelength in a range of about 300 nm to about 400 nm, and the second light has a wavelength in a range of about 630 nm to about 660 nm.

9. The light emitting diode of claim 3, wherein the upper substrate and the lower substrate are each generally transparent and comprise one of glass, plastic and resin.

10. The light emitting diode of claim 3, wherein the organic solution comprises at least one of toluene, chloroform and ethanol.

11. A light emitting diode (LED) comprising:
a base including a cavity, the cavity having a bottom and an opening;
an LED chip disposed on the bottom and configured to generate a first light; and
a light conversion layer including an upper substrate, a middle substrate, a lower substrate disposed between the upper substrate and the lower substrate, a sealing material disposed at an edge portion between the upper substrate and the lower substrate and an organic solution with a wavelength conversion particle; dispersed within the organic solution
wherein:
the light conversion layer is disposed on an upper surface of the base; and
the organic solution with the wavelength conversion particle fills gaps formed between the upper substrate and the middle substrate, and between the middle substrate and the lower substrate.

12. The light emitting diode of claim 11, wherein the organic solution between the middle substrate and the lower substrate converts a portion of the first light into a second light, and the organic solution between the middle substrate and the upper substrate converts a portion of the first light into a third light.

13. The light emitting diode of claim 12, wherein the wavelength conversion particle comprises quantum dots, the quantum dots including at least one of group II, III, V and VI compound semiconductors.

14. The light emitting diode of claim 13, wherein the first light has a wavelength in a range of about 440 nm to about 500 nm, the second light has a wavelength in a range of about 630 nm to about 660 nm, and the third light has a wavelength in a range of about 520 nm to about 560 nm.

15. The light emitting diode of claim 13, wherein the upper substrate, the middle substrate, and the lower substrate are each generally transparent and comprise at least one of glass, plastic and resin.

16. A backlight assembly comprising:
a light emitting diode (LED) including:
a base including a cavity with a bottom and an opening;
an LED chip disposed on the bottom and configured to generate a first light; and
a light conversion layer including an upper substrate, a lower substrate, and a wavelength conversion particle disposed between the upper substrate and the lower substrate, the light conversion layer configured to convert a portion of the first light into a second light;
an optical sheet disposed above the light emitting diode; and
a receiving container receiving the light emitting diode and the optical sheet;
wherein the light conversion layer is disposed on an upper surface of the base, the light conversion layer comprises an organic solution filling a gap between the upper substrate and the lower substrate, and the wavelength conversion particle is dispersed within the organic solution.

17. The backlight assembly of claim 16, wherein the wavelength conversion particle comprises quantum dots, the quantum dots including at least of group II, III, V and VI compound semiconductors.

18. The backlight assembly of claim 17, wherein a pair of the LEDs comprises:
a blue-green LED, the first light of the blue-green LED emitting light having a wavelength in a range of about 440 nm to about 500 nm, and the second light of the blue-green LED emitting light having a wavelength in a range of about 520 nm to about 560 nm; and
a blue-red LED, the first light of the blue-red LED emitting light having a wavelength in a range of about 440 nm to about 500 nm, and the second light of the blue-red LED emitting light having a wavelength in a range of about 630 nm to about 660 nm.

19. A backlight assembly comprising:
a light emitting diode (LED) including:
a base including a cavity with a bottom and an opening;
an LED chip disposed on the bottom and configured to generate a first light; and
a light conversion layer including an upper substrate, a middle substrate, a lower substrate, and a wavelength conversion particle disposed between the upper substrate and the middle substrate and between the middle substrate and the lower substrate, the light conversion layer configured to convert a portion of the first light into a second light;
an optical sheet disposed above the light emitting diode; and
a receiving container receiving the light emitting diode and the optical sheet;
wherein the light conversion layer is disposed on an upper surface of the base, and an organic solution fills gaps formed between the upper substrate and the middle substrate, and between the middle substrate and the lower substrate.

20. The backlight assembly claim of 19, wherein the organic solution between the middle substrate and the lower substrate converts a portion of the first light into a second light, and the organic solution between the middle substrate and the upper substrate converts a portion of the first light into a third light.

21. The light emitting diode of claim 20, wherein the wavelength conversion particle comprises quantum dots, the quantum dots including at least one of group II, III, V and VI compound semiconductors.

22. The light emitting diode of claim 21, wherein the first light has a wavelength in a range of about 440 nm to about 500 nm, the second light has a wavelength in a range of about 630 nm to about 660 nm, and the third light has a wavelength in a range of about 520 nm to about 560 nm.

23. A method of manufacturing a light emitting diode comprising:
   providing an upper substrate of a light conversion layer and a second substrate of the light conversion layer, each of which are transparent and comprise one or more of glass, plastic and resin;
   filling a gap formed between the upper substrate and the second substrate with a wavelength conversion particle dispersed in an aqueous solution;
   providing a base, the base including a cavity with a bottom and an opening, and an LED chip disposed on the bottom and configured to generate a first light; and
   placing the light conversion layer on an upper surface of the base.

24. The method of claim 20, wherein the wavelength conversion particle comprises quantum dots, the quantum dots including at least one of group II, III, V and VI compound semiconductors.

25. The light emitting diode of claim 1, further comprising a resin covering the LED chip and filling the cavity.

26. The light emitting diode of claim 11, further comprising a resin covering the LED chip and filling the cavity, wherein the sealing materials seal each joint portions between the upper substrate and the middle substrate and between the middle substrate and the lower substrate.

27. The backlight assembly of claim 16, wherein the light emitting diode further comprises a resin covering the LED chip and filling the cavity, and sealing materials seal a joint portion between the upper substrate and the lower substrate.

28. The backlight assembly of claim 19, wherein the light emitting diode further comprises a resin covering the LED chip and filling the cavity, and sealing materials seal each joint portions between the upper substrate and the middle substrate and between the middle substrate and the lower substrate.

29. The method of claim 23, further comprising sealing a joint portion between the upper substrate and the lower substrate with sealing materials, and covering the LED chip and filling the cavity using a resin.

* * * * *